Sept. 28, 1965 W. MUELLER 3,209,209

MEANS FOR CONNECTING ELECTRICAL COMPONENT TO CIRCUIT BOARD

Filed Feb. 21, 1963

INVENTOR.
WALTER MUELLER
BY
D E Kessler
ATTORNEY

3,209,209
MEANS FOR CONNECTING ELECTRICAL COMPONENT TO CIRCUIT BOARD

Walter Mueller, Detroit, Mich., assignor to Burroughs Corporation, Detroit, Mich., a corporation of Michigan
Filed Feb. 21, 1963, Ser. No. 260,227
6 Claims. (Cl. 317—101)

This invention relates to an assembly for connecting an electrical component to a circuit board.

Most conventional methods of mounting an electrical component on a circuit board, such as a printed circuit panel, entail inserting the lead wires of the component through holes in the circuit board, bending the wires into contact with the circuit of the board, and then soldering the bent lead wires to the circuit of the board. Many disadvantages are present in these conventional techniques. Among the disadvantages are: cold solder joints; time spent in positioning and bending the lead wires; possible heat damage to the component and the adjacent portions of the circuit of the board.

The present invention overcomes these disadvantages by providing an electrical component assembly which requires no soldering in direct contact with the circuit board. Moreover, in a preferred embodiment of the invention no soldering of any kind is required in order to connect the component to the circuit board. Furthermore, the present invention provides protection of the electrical component in addition to any protection afforded by the component's own encapsulation.

The present invention provides an assembly for connecting an electrical component to electrically conductive elements borne by a support of electrically insulating material comprising assembly means including a first electrically conductive portion and a second electrically conductive portion which are electrically insulated from one another and mechanically joined to each other, at least one of said portions being adapted to secure said assembly to said support, an electrical component disposed within said assembly means and electrically connected to at least one of said portions, and at least one of said portions being adapted to connect electrically said electrical component to a portion of said electrically conductive elements borne by said support.

The invention also provides apparatus for connecting an electrical component to a circuit panel having a printed circuit on each of its two major surfaces, comprising, in combination, an electrical component, an assembly housing said component, at least one insulator member electrically insulating one portion of said assembly from another portion of said assembly, said component having one terminal electrically connected to said one portion and another terminal electrically connected to said other portion, said one portion being adapted to be electrically connected to one of said printed circuits, said other portion being adapted to be electrically connected to the other of said printed circuits, and at least one of said portions being adapted to be electrically connected to its associated printed circuit without soldering.

In addition, the invention provides an electrical mounting device comprising, in combination, a metallic screw member having an externally threaded shank and an enlarged head on one end of the shank, said head having a cavity in the interior thereof and being shaped for engagement by a tool for turning the member, means electrically insulating at least a portion of the head from the shank, and an electrical component positioned wholly in the cavity of the head and having one electrical terminal thereof in electrical connection with the shank and another electrical terminal thereof connected to said insulated portion of the head.

An object of this invention is to provide a novel assembly for connecting an electrical component to a circuit board.

Another object is to provide an electrical component assembly particularly adapted for use with printed circuit panels.

An additional object is to provide a component assembly which may be mounted on a circuit board quickly, cheaply, and rigidly without the use of soldering.

A related object is to provide a component assembly which may be mounted on a printed circuit panel without the necessity of soldering in direct contact with the surfaces of the circuit panel.

A further object is to provide a component assembly which may be secured to a circuit board by use of a cooperating tool, such as a screwdriver.

Other objects will appear from the accompanying description, claims and drawings.

In order that the disclosure will be more fully understood and readily carried into effect, the following detailed description is given with reference to the accompanying drawings in which.

Figure 1:
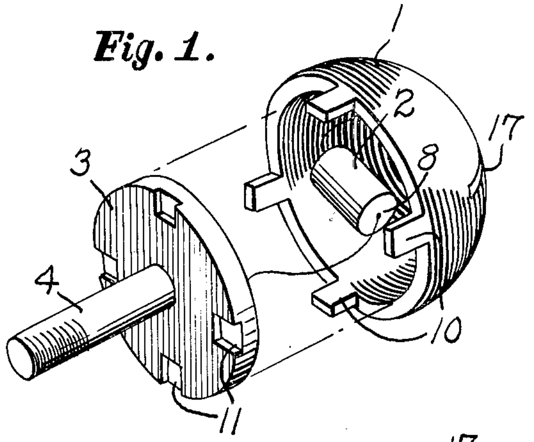
FIG. 1 is a perspective view of a component assembly shown partly unassembled.
Figures 3, 4:
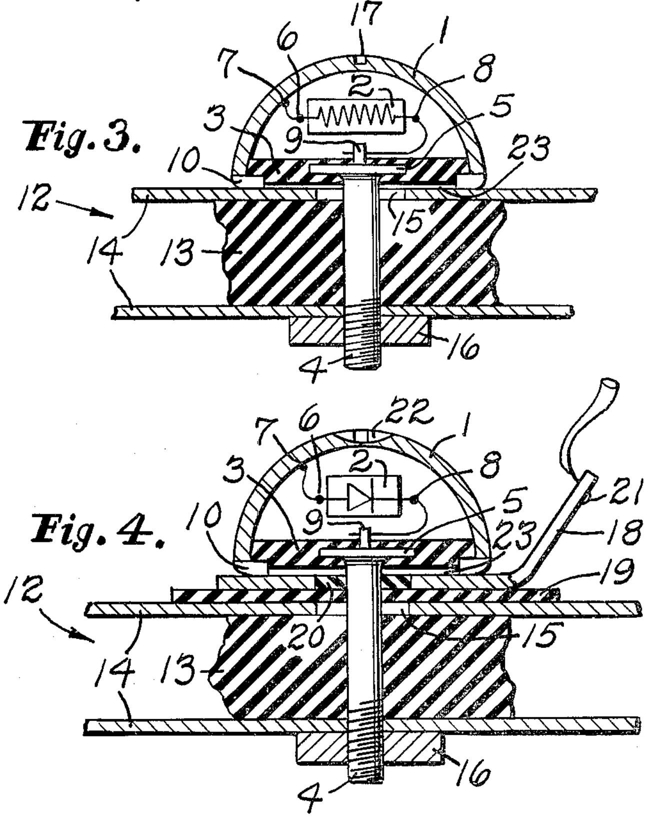
FIG. 3 is a sectional view of the assembly of FIG. 2 shown affixed to a printed circuit panel.
FIG. 4 is a sectional view of a modified assembly shown affixed to a printed circuit panel.

FIG. 1 shows one embodiment of an electrical component assembly according to the present invention. The assembly is shown in an unassembled condition. A hollow hemispheric metallic cap 1 houses an electrical component 2. An insulator 3 closes the open end of cap 1 and serves to insulate electrically cap 1 from a threaded metallic screw shank 4. The insulator 3 is fabricated so as to be unitary with shank 4. One manner of making insulator 3 unitary or integral with shank 4 is to form a boss-like enlargement 5 on one end of shank 4 (FIGS. 3 and 4). This may be done in any suitable manner, such as by swaging, cold heading, upsetting, or rolling. After the enlargement 5 has been formed, insulator 3 may be molded around and in direct contact with enlargement 5 on shank 4.

One terminal 6 of electrical component 2 is connected to cap 1, as at terminal 7 on cap 1. Another terminal 8 of component 2 is connected to shank 4, as at terminal 9 on shank 4.

Figure 2:
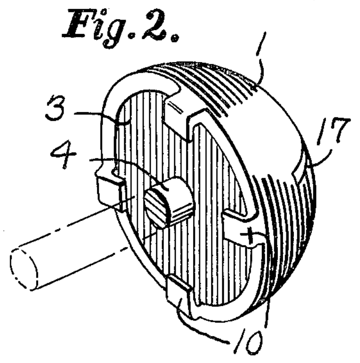
FIG. 2 is a perspective view of the assembly of FIG. 1 shown assembled.

Cap 1 is provided with prongs 10 which mate with notches 11 in insulator 3. When the unitary shank 4 and insulator 3 are positioned to close the open end of cap 1, the prongs 10 are inserted and bent over into notches 11 (FIG. 1 and 2). This provides rigid mechanical connection between cap 1 and insulator 3 so that insulator 3 together with integral shank 4 will move and rotate in unison with cap 1.

FIG. 3 shows the assembly of FIG. 2 affixed to a printed circuit panel 12. Panel 12 includes a nonconductive support 13 having a conductive printed circuit 14 on each of the two major surfaces of support 13. A hole is formed in panel 12 at the desired location for the assembly. A portion of the printed circuit 14 near the cap end of shank 4 is removed so that shank 4, when inserted in the hole in panel 12, will not contact the printed circuit 14 near the cap end of shank 4. This provides an annular space 15 concentric with the hole. The assembly is inserted in the hole and a screw nut 16 is secured on the exposed end of shank 4. Tightening nut 16 ensures good electrical contact between shank 4 and lower printed circuit 14, and at the same time forces prongs 10 into intimate contact with upper printed circuit 14. Insertion and securement of the assembly is facilitated by providing cap 1 with a tool-receiving portion, such as screw slot 17.

Thus, a solderless assembly is provided for mounting and electrically connecting an electrical component to a circuit board, such as a printed circuit panel, in a rapid, safe and inexpensive manner.

When the circuitry is energized, the current may flow though upper printed circuit 14, prongs 10, cap 1, terminal 7, terminal 6, component 2, terminal 8, terminal 9, shank 4, nut 16 to lower printed circuit 14.

FIG. 4 shows another embodiment of the inventive assembly. In this embodiment, prongs 10 are not in direct contact with upper printed circuit 14, but instead contact a metallic solder lug 18. An insulator member 19 is positioned between lug 18 and upper printed circuit 14. Shank 4 passes through an appropriate hole in lug 18 and insulator member 19. The hole in lug 18 retains an insulating ring 20 to insulate lug 18 from direct contact with shank 4. An electrical connection, such as by solder connection 21, may be formed on a portion of lug 18 to connect cap 1 to any desired component or portion of the circuitry. It should be noted that solder connection 21 is sufficiently remote, and insulated, from upper printed circuit 14 to avoid any heat damage to upper printed circuit 14 when soldering takes place. Lug 18 is also particularly useful when component 2 has more than two operative terminals, as for example a transistor. In such a case, an appropriately shaped cap and lug may be employed to accommodate the three electrode terminals.

The assembly of FIG. 4 has a star-shaped notch 22, instead of slot 17 of the assembly of FIGS. 1–3. In this regard, it should be noted that any suitable tool-receiving portion may be employed to receive a screwdriver or the like. For example, a socket head groove may be equally employed.

The invention is not limited to the use of threaded screw shanks and screw nuts. Any suitable fastening means may be used, such as peening, riveting, clipping, pins, or spreadable shank members. In addition, shank 4 need not necessarily pass completely through the circuit board. For example, shank 4 may terminate within support 13 as when only one printed circuit 14 is used.

It is not necessary to provide an annular space, similar to space 15, in the vicinity of the lower end of shank 4 and lower printed circuit 14. In fact, if ample electrical contact is provided between the threads of shank 4 and lower printed circuit 14, then nut 16 may be eliminated.

Prongs 10 serve to join cap 1 rigidly and fixedly to insulator 3; to connect electrically cap 1 to upper printed circuit 14; to provide a self-cleaning contact; and to provide a ventilating space 23 beneath insulator 3.

Component 2 may be of any desired type and have any number of terminals, such as resistors, inductors, capacitors, semiconductors, switches, diodes, transistors, or rectifiers. Furthermore, the component 2 need not be completely enclosed. Cap 1 may be formed with an open top to expose component 2 to the ambient, as may be necessary to dissipate heat generated by component 2. In such a case, cap 1 may be any open-topped polygonal-shaped enclosure formed to mate with a cooperatin gtool, such as a socket-head wrench.

Insulator 3 is not restricted to be disc-shaped. Insulator 3 may be formed to aid in holding component 2 in fixed position, or it may completely fill the interior of cap 1 and surround component 2.

Where the dissipation of heat is particularly important, the support 13 may include suitable heat sink material, such as aluminum or copper. A central layer of such heat sink material may be employed. In addition to dissipating heat produced when component 2 is energized, the heat sink will also prevent heat damage when solder connection 21 (FIG. 4) is made.

An important advantage of the inventive assembly resides in its easy mounting and removal. In some embodiments, no soldering is required to mount and connect the assembly. In all embodiments, no heating or unsoldering is required to remove or disconnect the assembly from the board.

Obviously many modifications and variations of the present invention are possible in light of the above teachings. It is therefore to be understood that within the scope of the invention, the invention may be practiced otherwise than as specifically described and illustrated.

What is claimed is:

1. An electrical component unit for connecting an electrical component to a circuit board having electrical conductors lying in substantially two parallel planes separated by a non-conductive support, said unit comprising in comibnation:

a completely-solid stud extending through said circuit board transverse to said two planes and extending beyond said two planes, said stud securing said unit to said circuit board and electrically contacting one end of said stud to the electrical conductors lying in one of said two planes;

an enlarged head mechanically and rigidly joined to the other end of said stud, said head having a portion thereof electrically contacting the electrical conductors lying in the other one of said two planes;

a electrical component mounted within said head, said component having one terminal thereof electrically connected to said other end of said stud and having another terminal thereof electrically connected to said head; and a non-conductive member mechanically joining said head to said stud and electrically insulating said head from said stud.

2. An electrical component unit for connecting an electrical component to a circuit board having electrical conductors lying in at least one parallel plane thereon, said unit comprising in combination:

a completely-solid threaded screw stud having one end extending into said circuit board transverse to said plane and securing said unit to said circuit board;

a screw head mechanically and rigidly joined to the other end of said stud;

an electrical component mounted within said head, said component having one terminal thereof electrically connected to said other end of said stud and having the other terminal thereof electrically connected to said head; and a non-conductive member mechanically and rigidly joined to said other end of said stud and electrically insulating said head from said stud; and a plurality of equally-spaced prongs forming part of said head, said prongs mechanically and rigidly joining said head to said non-conductive member and electrically contacting a portion of the electrical conductors lying in said plane.

3. An electrical component unit for connecting an electrical component to a circuit board having electrical conductors lying in substantially two parallel planes separated by a non-conductive support, said unit comprising in combination:

a completely-solid threaded screw stud extending through said circuit board transverse to said two planes and extending beyond said two planes;

a nut threadedly engaged on one end of said stud securing said unit to said circuit board and electrically contacting said one end of said stud to the electrical conductors lying in one of said two planes;

a screw head mechanically and rigidly joined to the other end of said stud, said head having a portion thereof electrically contacting the electrical conductors lying in the other one of said two planes;

an electrical component mounted within said head, said component having one terminal thereof electrically connected to said other end of said stud and having the other terminal thereof electrically connected to said head; and a non-conductive member mechanically joining said head to said stud and electrically insulating said head from said stud.

4. An electrical component unit for connecting an electrical component to a circuit board having electrical conductors lying in substantially two parallel planes separated by a non-conductive support, said unit comprising in combination:

a completely-solid threaded screw stud extending through said circuit board transverse to said two planes and extending beyond said two planes;

a nut threadedly engaged on one end of said stud securing said unit to said circuit board and electrically contacting said one end of said stud to the electrical conductors lying in one of said two planes;

a screw head mechanically and rigidly joined to the other end of said stud;

an electrical component mounted within said head, said component having one terminal thereof electrically connected to said other end of said stud and having the other terminal thereof electrically connected to said head;

a first non-conductive member mechanically joining said head to said stud and electrically insulating said head from said stud;

a second non-conductive member mounted adjacent the other one of said planes and encircling said stud toward said other end of said stud;

a third non-conductive member mounted adjacent said second non-conductive member and encircling said stud toward said other end of said stud; and a solder lug mounted adjacent said second non-conductive member and encircling said third non-conductive member so that said lug is insulated from said stud, and said lug being in electrical contact with said head, whereby electrical current may flow through the conductors lying in said one of the two planes, said nut, said stud, said electrical component, said head, and said solder lug.

5. Means for mechanically securing and electrically connecting an electrical component to two conducting surfaces of a circuit board comprising, in combination, a hollow screw head encosing said electrical component, a threaded screw shank placed through said board and transverse to said two surfaces, an insulating element integrally connecting and electrically insulating said head and said shank, said electrical component having one terminal connected to said head and another terminal connected to said shank, and a nut for threadedly engaging said shank to secure said means to said board and to ensure electrical contact of said shank with one of said surfaces and electrical contact of said head with the other of said surafces.

6. Means for connecting an electrical component to a circuit board having an electrical circuit on each of its two major surfaces, comprising, in combination, a screw shank inserted through said board transverse to said surfaces, a nut threadedly engaging one end of said shank to connect electrically said shank to the circuit on one of said surfaces, a screw head in which said component is disposed and to which one terminal of said component is electrically connected, an insuating member joining the other end of said shank to said head, a solder lug disposed between said head and the other of said surfaces, said lug contacting said head and being insulated from said shank, and a second insulating member disposed between said lug and said other surface.

References Cited by the Examiner

UNITED STATES PATENTS

| | | | |
|---|---|---|---|
| 2,059,712 | 11/36 | Schellenger | 200—168 X |
| 2,445,719 | 7/48 | Sylvester | 317—110 X |
| 2,760,176 | 8/56 | Del Camp. | |
| 2,992,372 | 7/61 | Himeon et al. | 317—234 |
| 3,109,880 | 11/63 | Newby | 174—35 |

FOREIGN PATENTS

| | | |
|---|---|---|
| 586,079 | 10/59 | Canada. |

JOHN F. BURNS, *Primary Examiner.*

JOHN P. WILDMAN, LARAMIE E. ASKIN, *Examiners.*